United States Patent
Ott et al.

(10) Patent No.: US 6,367,040 B1
(45) Date of Patent: *Apr. 2, 2002

(54) SYSTEM AND METHOD FOR DETERMINING YIELD IMPACT FOR SEMICONDUCTOR DEVICES

(75) Inventors: Reinhold Ott, Richmond; Herbert Lammering; Dieter Rathei, both of Glen Allen, all of VA (US)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/228,178

(22) Filed: Jan. 11, 1999

(51) Int. Cl.$^7$ ................................................ G01R 31/28
(52) U.S. Cl. ...................................................... 714/724
(58) Field of Search ................................ 714/724, 733; 438/7; 700/110, 121; 716/19; 382/149

(56) References Cited

U.S. PATENT DOCUMENTS

| | | | | |
|---|---|---|---|---|
| 4,801,869 A | * | 1/1989 | Sprogis | ...................... 714/733 |
| 5,355,212 A | * | 10/1994 | Wells et al. | ............. 356/237.4 |
| 5,438,527 A | * | 8/1995 | Feldbaumer et al. | .......... 716/19 |
| 5,598,341 A | * | 1/1997 | Ling et al. | .................. 700/110 |
| 5,754,432 A | * | 5/1998 | Komatsuzaki et al. | ...... 700/110 |
| 5,761,064 A | * | 6/1998 | La et al. | ...................... 700/110 |
| 5,777,901 A | * | 7/1998 | Berezin et al. | ................ 716/19 |
| 5,787,190 A | * | 7/1998 | Peng et al. | .................. 382/145 |
| 5,822,218 A | * | 10/1998 | Moosa et al. | .................... 714/4 |
| 5,828,778 A | * | 10/1998 | Hagi et al. | .................. 382/145 |
| 5,940,300 A | * | 8/1999 | Ozaki | .......................... 700/121 |
| 5,943,437 A | * | 8/1999 | Sumic et al. | ................ 382/149 |
| 6,016,562 A | * | 1/2000 | Miyazaki et al. | ........... 714/724 |
| 6,017,771 A | * | 1/2000 | Yang et al. | ...................... 438/7 |
| 6,061,814 A | * | 3/2000 | Sugasawara et al. | ........ 714/724 |
| 6,169,960 B1 | * | 1/2001 | Ehrichs | ....................... 702/36 |

* cited by examiner

Primary Examiner—Albert Decady
Assistant Examiner—Joseph D. Torres (57) ABSTRACT

A method for determining yield impact of process steps for semiconductor wafers having a plurality of dies includes the steps of correlating defects on the dies to electrical failures on the dies to determine hits on the dies, computing kill rates for the dies based on hits for each inspection process, determining a number of dies to be killed by considering kill rates for the dies with hits to weight the defects of each die and determining a yield loss for each inspection process based on the number of dies to be killed and a total number of dies on the semiconductor wafer. A system is also included.

18 Claims, 4 Drawing Sheets

SYSTEM AND METHOD FOR DETERMINING YIELD IMPACT FOR SEMICONDUCTOR DEVICES

BACKGROUND

1. Technical Field

This disclosure relates to semiconductor device inspection and testing and more particularly, to a system and method for determining yield impact of defects detected during in-line inspections.

2. Description of the Related Art

Defect data for semiconductor chips is typically collected by laser scanning, optical or scanning electron microscope (SEM). These techniques are employed as in-line defect inspections during the production of semiconductor devices. Defects may include a plurality of different events which may have totally different impacts on chip yield. The inspection techniques often provide a total count of the number of defects detected in each process step. Total count information does not enable a test engineer to assign a yield loss to defects detected at each particular process step.

It is a common standard in the semiconductor industry to inspect wafers at various times by employing optical and other inspection tools, such as the techniques described above, during production. These inspections provide data to shorten yield learning cycles significantly by reacting instantly to process problems. As a result, the process engineer obtains the number of defects per wafer, x-y coordinates of each defect and a set of parameters (different for different tools) specific for each particular defect. Any irregularities such as structural imperfections, particles, residuals or embedded foreign material are considered as defects. At the present time, this data is needed to approach benchmark yields for any product.

Correlation between in-line defect data and actual yield data is not accurate for small sample sizes (e.g. inaccurate one wafer only), or (because of the enormous memory sizes) the existing locally detailed yield data (e.g. bit maps) is not available for a sufficient sample of manufactured wafers. In-line defects are detected by the inspection techniques in between process steps for fabricating the semiconductor device. Actual defects are determined using electrical tests after the chips are fabricated. After electrical testing, some chips with defects may be salvaged by employing redundancies. Prior to employing the redundancies pre-fuse yield data may be obtained to determine if redundancies are needed or would improve yield.

Considering killing probabilities of any defect (probability p of the defect to kill the entire chip), the total defect count is comprised of events with all values of killing probabilities between 0 and 1. The total defect count information on its own or even including further characterizations for each single defect by optical microscopes, SEM, AFM, EDX (either manual review or automated defect classification) is not sufficient to assign an accurate number of yield loss to each process for complex chip designs (e.g. numerous redundancies on memory products). Further, the review of all inspected defects (even using automated classification) may delay the manufacturing process of semiconductor chips and yield learning cycles significantly.

To obtain useful yield impact information, it is desirable to correlate the actual defect data to electrical fails. Currently available yield correlation software packages distinguish from each other either in spatial resolution or in the algorithm which determines yield loss.

Regarding the spatial resolution, two extremes are available. While some yield correlation software may use wafer level defect and yield data, others take advantage of the spatial information of defect location on the wafer (i.e., accurate to within a given distance, for example, 15 microns, using the most accurate inspection tools) and correlate the spatial information of defect location to the most detailed available electrical information, that is, bitmap data. The advantage of the more detailed correlation with electrical bitmaps is the available amount of data which provides reasonable statistics for even a single wafer. The likelihood that a failed bit can be truly assigned to a defect found within a 15 $\mu$m radius is for average yield and defect data above 99.99% ($\sim 1 \times 10^{-5}$). In addition, using specific electrical fail pattern information and available defect parameters improve the accuracy of this method. The disadvantage of this method is the excessive amount of data that has to be handled to monitor a production line. This confines the applicability of this method for volume wafer analysis.

On the other hand, using wafer level data provides reasonable accuracy only for huge samples (>50 wafer). This method is not useful for any lot or wafer level split analysis, which is needed for rapid yield learning.

Therefore a need exists for a system and method for correlating in-line defect data with pre-fuse yield data to determine a yield loss for each defect inspected wafer.

SUMMARY OF THE INVENTION

A method for determining yield impact of process steps for semiconductor wafers having a plurality of dies includes the steps of correlating defects on the dies to electrical failures on the dies to determine hits on the dies, computing kill rates for the dies based on hits for each inspection process, determining a number of dies to be killed by considering kill rates for the dies with hits to weight the defects of each die and determining a yield loss for each inspection process based on the number of dies to be killed and a total number of dies on the semiconductor wafer.

Another method for determining yield impact of process steps for semiconductor wafers having a plurality of dies includes the steps of inspecting a semiconductor wafer to determine defects, collecting defect data for each inspection process performed on the semiconductor wafer, the defect data including locations of defects on the semiconductor wafer, electrically testing the semiconductor wafer to determine electrical failures for dies on the semiconductor wafer, correlating the defects to the electrical failures to determine hits on the dies, computing kill rates for the dies based on hits for each inspection process, determining a number of dies to be killed by considering kill rates for the dies with hits to weight the defects of each die and determining a yield loss for each inspection process based on the number of dies to be killed and a total number of dies.

A program storage device readable by machine, tangibly embodying a program of instructions executable by the machine to perform method steps for determining yield impact of process steps for semiconductor wafers having a plurality of dies, the method steps include correlating defects on the dies to electrical failures on the dies to determine hits on the dies, computing kill rates for the dies based on hits for each inspection process, determining a number of dies to be killed by considering kill rates for the dies with hits to weight the defects of each die and determining a yield loss for each inspection process based on the number of dies to be killed and a total number of dies on the semiconductor wafer.

In other methods which may be implemented by a program storage device readable by machine, tangibly embodying a program of instructions executable by the machine to perform method steps for determining yield impact of process steps for semiconductor wafers, the step of correlating defects on the dies to electrical failures on the dies to determine hits on the dies may include the step of determining hits by assigning the defects of the dies to the electrical failures on the dies. The step of computing kill rates includes the step of computing kill rates for a given process inspection by dividing a number of hits on electrically failed dies by a number of defects for the process inspection may be included. The step of determining a number of dies to be killed by considering kill rates for the dies with hits to weight the defects of each die may include the steps of determining a number of dies to be killed by considering all dies with hits, initializing the number of dies to be killed to zero, modifying the number of dies to be killed by: calculating a kill rate ratio between a kill rate for each process inspection having hits and a sum of the kill rates for all process inspections having hits and adding the ratio to a previous number of dies to be killed, the previous number of dies to be killed being obtained at a previously considered die and repeating the step of modifying until all dies have been considered. The step of modifying is preferably performed using the formula:

$$k_i = k_{i,previous} + m \cdot \frac{r_i}{\sum_{i=1}^{n} r_i} \quad \text{EQ. 1}$$

where $k_i$ is a newly calculated number of dies to be killed for inspection process i, $k_{i,previous}$ is the previously calculated number of dies to be killed for the defects of inspection process i, $r_i$ is the kill rate for a given inspection process i, n is the number of processes which provided hits to the dies to be killed and m is the number of defects of a given type for a die being considered for the inspection process i. The step of determining a yield loss for each inspection process based on the number of dies to be killed and a total number of dies may include calculating the yield loss by dividing the number of dies to be killed for a given inspection process by the total number of dies of the semiconductor wafer. The method may further include the step of determining a killing probability yield loss for each inspection process based on the number of dies to be killed for each inspection process and a total number of defects for the inspection process.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

This disclosure relates to semiconductor device inspection and testing and more particularly, to a system and method for determining yield impact of defects detected during in-line inspections. The present invention provides a correlation between in-line defects and electrical tests by correlating yield data from a compressed bit map to calculate yield loss for each defect inspected wafer. The present invention provides important information about which processes need improving and provides a method for calculating yield loss and killing probabilities for the wafers between inspection steps during fabrication of the wafers.

Using available defect and yield data, the present invention correlates defect data to electrical fail region latches. This kind of electrical test data may be available for every pre-fuse tested wafer and therefore limits the applicability of the final correlation only to the sample of wafers having defect data. The sizes of these electrical fail region latches or compressed bitmaps are preferably in the range of the coordinate accuracy of in-line inspection tools. This implies that the difference in spatial resolution between the bitmap/defect and failed region latch/defect (compressed bitmap) correlation is negligible. A well-defined definition of the compressed bitmap preferably provides similar electrical information as the bit map data for the in-line defect data.

As described, a method is provided which calculates yield loss and killing probabilities for the processed wafer between two adjacent defect inspection steps. This method includes an in situ calculation of the killing probability of defects at certain process steps. These killing probabilities mainly influence the yield impact and are preferable for accurate yield impact determinations. Advantageously, the method calculates yield impact for each wafer. This ensures process problems with unusual defects are treated appropriately for each individual wafer.

Figure 1:
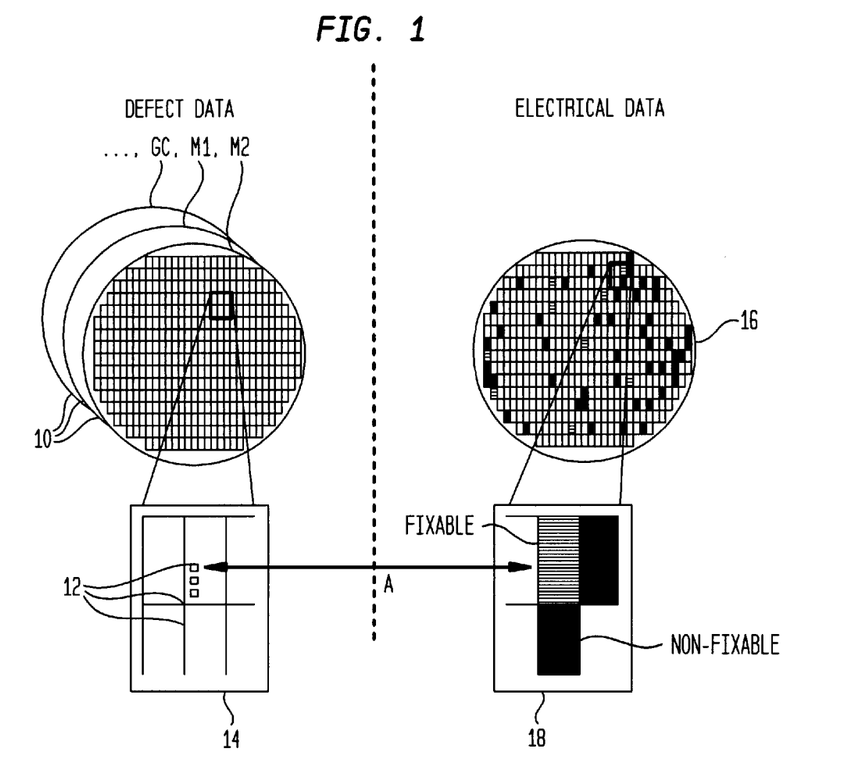
FIG. 1 depicts defect layers for a semiconductor wafer for mapping defects occurring at each inspection process on a left side of FIG. 1 and depicts a compressed bitmap for a semiconductor wafer for mapping die or chip electrical failures on a right side of FIG. 1.

Referring now in specific detail to the drawings in which like reference numerals identify similar or identical elements throughout the several views, and initially referring to FIG. 1, during wafer inspection processes, wafers are processed to form electrical or electronic components thereon. After a given process step, the wafers are inspected to determine inconsistencies, non-uniformities or other defects which may arise during processing. In one example, for a wafer used for fabricating memory chips which will be used hereinafter to illustratively describe the invention by way of example, process steps may include, inter alia, gate conductor (GC) formation, metal layers (i.e, M1, M2, etc.) and other fabrication steps. After a given process step, defect data may be obtained by a plurality of different techniques using a plurality of different inspection tools which are known to those skilled in the art. Some examples include inspection tools and techniques such as scanning electron microscopes (SEM), atomic force microscopes (AFM), energy dispersive X-ray spectroscopy (EDX) and other known tools and processes.

As a result of the inspection which is performed in-line, i.e., on the fabrication line, defects for a given process are mapped on a defect map or bitmap 10 which represents a wafer to be inspected. As shown on the left side of the vertical dotted line in FIG. 1, each process, for example GC, M1 and M2, includes a defect map 10 showing defects discovered during the inspection following each of the processes. Each inspection process may be performed after a single processing step or after several processing steps. Typical memory chips may include 10 or more inspections in between predetermined process steps. Defects 12 are shown in an exploded section 14.

Upon completion of all processes, an electrical test or tests are performed to determine the functionality of the wafer or chips on the wafer. DC tests may be performed to determine if electrical tests failed due to support circuitry, i.e., failures in conductive lines or logic circuits. Electrical failures within a memory array may be indicated by a compressed bit map 16, pre-fuse, that is, before redundancies are employed. Compressed bit map 16 indicates different failure types as well, for example, fixable failures which may be fixed using redundancies and non-fixable failures which cannot be fixed by redundancies. Compressed bit map 16 data indicates failed devices in a failure region. A failure region represents a plurality of bits, each bit representing a memory cell for example. Each bit includes pass/fail information about the memory cell which the bit is representing.

Since defects may not rise to the level of killing a wafer or chip on the wafer, electrical test data is a more accurate measure of yield. Advantageously, the present invention correlates the electrical test data (compressed bitmap) to defect data to determine yield and the impact of certain defects on the yield.

A method for correlating the electrical test data with the defect data in accordance with the present invention will now be described. In describing the method in accordance with the invention several definitions are used. A hit is an event which occurs at process step "i" if a certain electrical fail (for DC or fail region testing) may be assigned to a certain defect which was inspected and discovered at process step "i". In other words, a hit is achieved when the defect data also produces an electrical failure. As shown in FIG. 1, a hit is indicated between the defect shown in exploded section 14 which produces an electrical fail in exploded section 18 as indicated by arrow "A". A hit rate ($hr_i$) at process step "i" is the number of hits of process step "i" divided by the number of defects of process "i". A kill rate ($r_i$) for process step "i" is the number of hits of electrically failed dies (or chips on the wafer) of process "i" divided by the number of defects of process "i".

The calculated killing rate $r_i$ of a defect detected at process "i" may be used for a first estimation as will be described below. Assuming that a killed die includes defects from different process steps which include hits, the computation of kill rates provides estimations used to weight the probability of which defect caused the die or chip to be killed.

Figure 2:
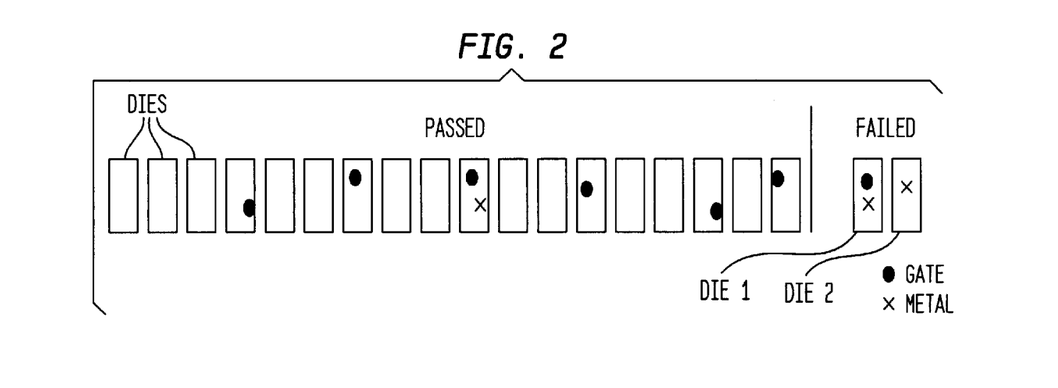
FIG. 2 illustrates a set of 20 dies having gate and metal defects in accordance with the present invention.

Referring to FIG. 2, 20 dies are illustratively shown to demonstrate the present invention and the determination of yield loss. Each die in this example has been fabricated using a plurality of process steps. The process steps that indicated defects at an inspection include the gate inspection defects (Gate) and metal 1 inspection defects (Metal1). Defects discovered at the gate inspection are indicated with an oval while defects discovered during metal 1 inspection are indicated by an "x". 18 dies passed and 2 failed electrical testing as indicated in FIG. 2. Since defects were only experienced in the Gate process and the Metal1 process, these processes are the only ones considered in the yield loss determination (only processes to provide hits).

Figure 3:
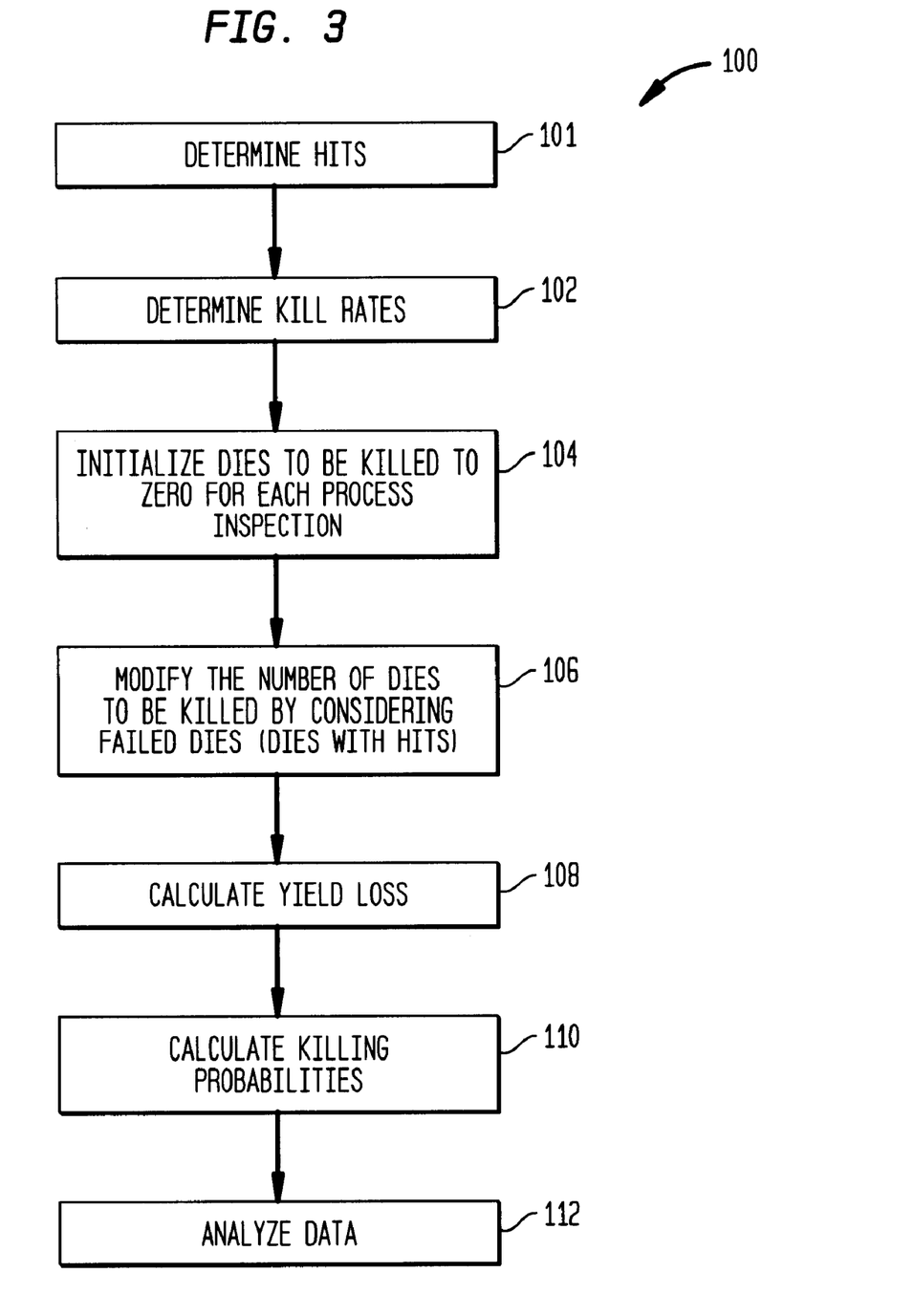
FIG. 3 is a flow/block diagram showing a method/system for determining yield loss in accordance with the present invention.
Figure 4:
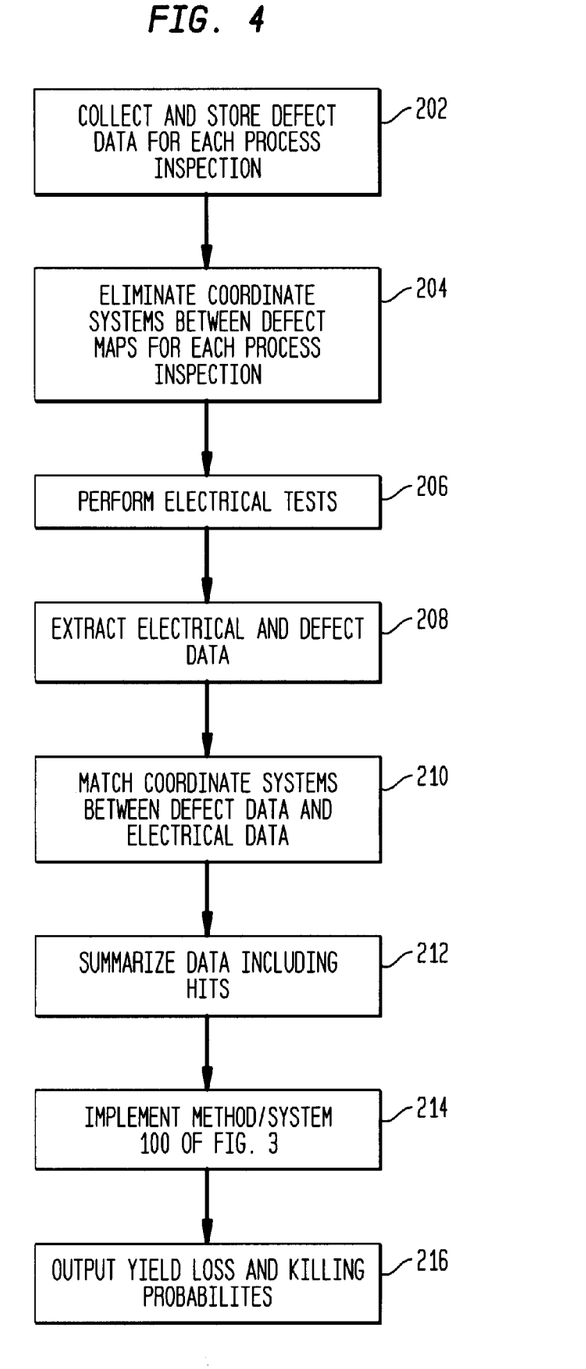
FIG. 4 is a flow/block diagram showing another method/system for determining yield loss in accordance with the present invention.

It should be understood that the elements shown in FIGS. 3–4 may be implemented in various forms of hardware, software or combinations thereof.

Preferably, these elements are implemented in software on one or more appropriately programmed general purpose digital computers having a processor and memory and input/output interfaces. Referring now to FIGS. 2 and 3, a flow/block diagram 100 is shown. In block 101, defects are correlated to electrical failures on the dies to determine hits as described above. In block 102, kill rates are calculated for each process. In this example, a kill rate $r_{Gate}$ is determined to be 1/7 or about 14% since 1 hit (1 failed die includes a Gate defect) is included and the total Gate defects is 7 (7 ovals). A kill rate $r_{Metal1}$ is determined to be 2/3 or about 66% since 2 hits (2 failed dies include metal1 defects) are include and the total Metal1 defects is 3 (3 x's).

In block 104, a number of dies assigned to be killed is initialized to zero for each process inspection. In the present example $k_{Gate}=0$ and $k_{Metal1}=0$. In block 106, all failed dies are passed through to modify the number of dies to be killed by using the formula:

$$k_i = k_{i,previous} + m \cdot \frac{r_i}{\sum_{i=1}^{n} r_i} \qquad \text{EQ. 1}$$

where $k_i$ is the newly calculated number of dies to be killed by the defects of process inspection or process step "i", $k_{i,previous}$ is the previously calculated number of dies to be killed by the defects of process step "i", $r_i$ is the kill rate for process step "i" ($r_i$ is zero if no defects from process "i" are present), n is the number of processes which provided hits to the dies to be killed and m is the number of defects of a given type for process "i" in the die being considered. Note, if a hit occurs on a die having 3 Gate defects, for example, than m=3 for the Gate process calculation. EQ. 1 is used to provide weighting to defect types present in a die with hits having one or more defects from different processes. Although EQ. 1 is shown as a sum of $k_{i,previous}$ and the kill rate for the present process step divided by the sum of the kill rates of the defects for the die, other weighting factors or coefficients may be included to further model killing probabilities and killing rates.

In the example, two dies are failed and labeled die 1 and die 2. Die 1 has a Gate defect and therefore from EQ. 1:

$$k_{Gate}=k_{Gate,previous}+(r_{Gate}/(r_{Gate}+r_{Metal1}))$$

since $k_{Gate}$ was initialized to zero $k_{Gate,previous}=0$, $r_{Gate}=0.14$ and $r_{Metal1}=0.66$ as described above. $k_{Gate}=0+0.18=0.18$. Similarly, a Metal1 defect is present in die 1 and therefore from EQ. 1:

$$k_{Metal1}=k_{Metal1,previous}+(r_{Metal1}/(r_{Gate}+r_{Metal1}))$$

since $k_{Metal1}$ was initialized to zero $k_{Metal1,previous}=0$, $r_{Gate}=0.14$ and $r_{Metal1}=0.66$ as described above. $k_{Metal1}=0+0.82=0.82$.

Die 2 has no Gate defect and therefore from EQ. 1:

$$k_{Gate}=k_{Gate,previous}+(r_{Gate}/(r_{Gate}+r_{Metal1}))$$

since $k_{Gate}$ was calculated for die 1 $k_{Gate, previous}=0.18$, $r_{Gate}=0$ since there are no Gate defects present in die 2 and $r_{Metal1}=0.66$ as described above. $k_{Gate}=0.18+0=0.18$ which is unchanged from die 1 as it should be since no Gate defects are present on die 2. A Metal1 defect is present in die 2 and therefore from EQ. 1:

$$k_{Metal1}=k_{Metal1,previous}+(r_{Metal1}/(r_{Gate}+r_{Metal1}))$$

since $k_{Metal1}$ was 0.82 for die 1, $k_{Metal1,previous}=0.82$, $r_{Gate}=0$ since no defects of this type are present and $r_{Metal1}=0.66$ as described above. $k_{Metal1}=0.82+1=1.82$.

Only 2 dies are considered since only 2 dies have hits, however, for a semiconductor wafer having a plurality of dies the modifying process for k continues for each die having a hit until all dies are considered for that wafer.

In block 108, a yield loss per layer $dY_i$ is computed for each process. The layer refers to a defect layer which may include a bitmap of the wafer showing defects for that process step. Yield loss is assigned by calculating $dY_i=k_i/N_0$ where $N_0$ is the number of dies per wafer, $k_i$ is number of dies assigned to be killed for process step "i" for the last die gone through in block 106. In the example, $dY_{Gate}=0.9\%$ since $k_{Gate}$ is 0.18 for die 2, i.e., the last die gone through and $N_0$ is 20 (the number of dies in FIG. 2). Likewise, $dY_{Metal1}=9.1\%$ since $k_{Metal1}$ is 1.82 for die 2, i.e., the last die gone through and $N_0$ is 20 (the number of dies in FIG. 2).

In block 110, a killing probability $kp_i$ for each process or defect layer is determined. $kp_i$ is computed as $kp_i=k_iD_i$ where $D_i$ is the number of defects at process step "i", $k_i$ is number of dies assigned to be killed for process step "i" for the last die gone through in block 106. The killing probability may be used to weight yield impact of defects from different layers, i.e., weight which process step is responsible for killing the die.

In the example, $kp_{Gate}=2.5\%$ since $k_{Gate}$ is 0.18 for die 2, i.e., the last die gone through and $D_{Gate}$ is 7 (the number of gate defects). Likewise, $kp_{Metal1}=60.6\%$ since $k_{Metal1}$ is 1.82 for die 2, i.e., the last die gone through and $D_{Metal1}$ is 3 (the number of Metal1 defects). When assessing failures, the probability that a die is killed by a Metal1 defect is significantly higher than for a Gate defect is this example. In block 112, yield loss and killing probabilities are analyzed to provide insight on process improvements and ways for improving yields.

Referring to FIG. 4, a flow/block diagram is shown for implementing the present invention. In block 202, defect data is collected and stored using one or more inspection tools and a memory storage device. The defect data is identified at each predetermined inspection or at each layer. It is preferred that defect data be stored in a common database. In block 204, since the one or more inspection tools may include different coordinate systems, the coordinate systems are eliminated to provide a common coordinate system for all defect data and to further provide compensation for any offsets etc. that were induced due to wafer securing systems, etc. In block 206, electrical tests are performed and failed region or electrical data is collected in a memory storage device which may be the same memory storage device in block 202.

In block 208, the defect data from block 202 and the electrical data from block 206 are extracted to perform computations in accordance with the present invention. In block 210, a script or program, preferably programed on a computer, is implemented to overlay defect data and electrical data and matches the different coordinate systems with high accuracy, for example, the accuracy is preferably less than 15 microns. In block 212, a data summary including hit information is stored in a table to make hit information available in following steps.

Figure 5:
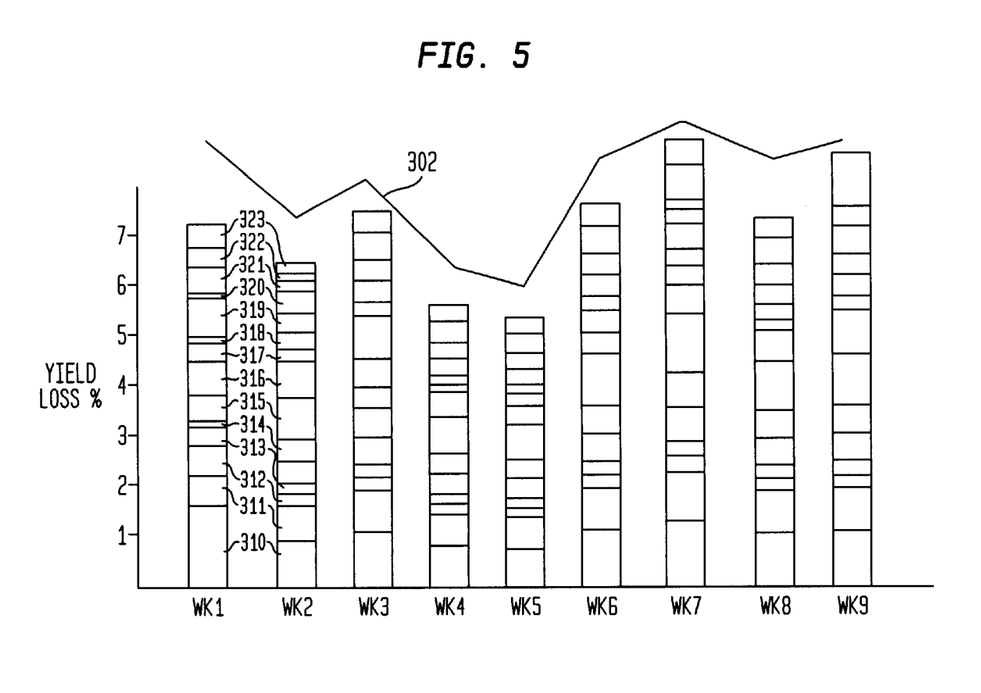
FIG. 5 is a bar chart showing yield loss over a period of several weeks and showing yield losses for each inspection process.

In block 214, method/system 100 of FIG. 3 is employed using the hit information, the defect data and the electrical data as described above to determine yield loss and killing probabilities for each layer in accordance with the present invention. In block 216, output data may be stored in tables, charts, etc. showing yield loss per defect inspection process. This data is than employed to make improvements and learn more about processing steps for semiconductor fabrication. Referring to FIG. 5, an example of an output summary chart illustratively shows yield loss on the y-axis for 9 weeks of accumulated data. A total yield loss is shown as line 302. A plurality of process steps 310–323 are shown showing the relative impact of yield loss at each process inspection.

Although the present disclosure described the invention in terms of a memory device, the invention is applicable to any semiconductor fabrication process in which yields are calculated to access production performance.

Having described preferred embodiments for a system and method for correlating defect data with electrical test data to determine yield loss and killing probabilities and for determining yield impact for semiconductor devices(which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for determining yield impact of process steps for semiconductor wafers having a plurality of dies comprising the steps of:

mapping a location for each defect within each die at one or more inspection process steps;

mapping a location for each electrical failure within each die;

correlating specific defects on the dies to each specific electrical failure where indicated, each said correlation thereby indicating a hit;

computing kill rates for the dies based on the hits;

determining a number of dies to be killed by considering kill rates for the dies with hits to weight the defects of each die, said determination effected by a method comprising the steps of:

determining a number of dies to be killed by considering all dies with hits;

initializing the number of dies to be killed to zero;

modifying the number of dies to be killed by:

calculating a kill rate ratio between a kill rate for each process inspection having hits and a sum of the kill rates for all process inspections having hits; and adding the ratio to a previous number of dies to be killed, the previous number of dies to be killed being obtained at a previously considered die; and repeating the step of modifying until all dies have been considered; and determining a yield loss for each inspection process based on the number of dies to be killed and a total number of dies on the semiconductor wafer.

2. The method as recited in claim 1 wherein the step of correlating defects on the dies to electrical failures on the dies to determine hits on the dies includes the step of determining hits by assigning the defects of the dies to the electrical failures on the dies.

3. The method as recited in claim 1 wherein the step of computing kill rates includes the step of computing kill rates for a given process inspection by dividing a number of hits on electrically failed dies by a number of defects for the process inspection.

4. The method as recited in claim 1 wherein the step of modifying is performed using the formula:

$$k_i = k_{i,previous} + m \cdot \frac{r_i}{\sum_{i=1}^{n} r_i} \qquad \text{EQ. 1}$$

where $k_i$ is a newly calculated number of dies to be killed for inspection process i, $k_{i,previous}$ is the previously calculated number of dies to be killed for the defects of inspection process i, $r_i$ is the kill rate for a given inspection process i, n is the number of processes which provided hits to the dies to be killed and m is the number of defects of a given type for a die being considered for the inspection process i.

5. The method as recited in claim 1 wherein the step of determining a yield loss for each inspection process based on the number of dies to be killed and a total number of dies includes calculating the yield toss b) dividing the number of dies to be killed for a given inspection process by the total number of dies of the semiconductor wafer.

6. The method as recited in claim 1, further comprising the step of determining a killing probability yield loss for each inspection process based on the number of dies to be killed for each inspection process and a total number of defects for the inspection process.

7. A method for determining yield impact of process steps for semiconductor wafers having a plurality of dies comprising the steps of:

inspecting a semiconductor wafer to determine defects;

collecting defect data for each inspection process performed on the semiconductor wafer, the defect data including locations of defects on the semiconductor wafer;

electrically testing the semiconductor wafer to determine electrical failures for electrically failing dies on the semiconductor wafer;

mapping a location for each defect within each die for each inspection process step;

mapping a location for each electrical failure within each die;

correlating specific defects on the does to each specific electrical failure where indicated, each said correlation thereby indicating a hit;

computing kill rates for the dies based on hits for each inspection process;

determining a number of dies to be killed by considering kill rates for the dies with hits to weight the defects of each die, said determination effected by a method comprising the steps of:

determining a number of dies to be killed by considering all dies with hits;

initializing the number of dies to be killed to zero;

modifying the number of dies to be killed by:

calculating a kill rate ratio between a kill rate for each process inspection having hits and a sum of the kill rates for all process inspections having hits; and adding the ratio to a previous number of dies to be killed, the previous number of dies to be killed being obtained at a previously considered die; and repeating the step of modifying until all dies have been considered; and determining a yield loss for each inspection process based on the number of dies to be killed and a total number of dies.

8. The method as recited in claim 7 wherein the step of correlating defects on the dies to electrical failures on the dies to determine hits on the dies includes the step of determining hits by assigning the defects of the dies to the electrical failures on the dies.

9. The method as recited in claim 7 wherein the step of computing kill rates includes the step of computing kill rates for a given process inspection by dividing a number of hits on electrically failed dies by a number of defects for the process inspection.

10. The method as recited in claim 7 wherein the step of modifying is performed using the formula:

$$k_i = k_{i,previous} + m \cdot \frac{r_i}{\sum_{i=1}^{n} r_i} \qquad \text{EQ. 1}$$

where $k_i$ is a newly calculated number of dies to be killed for inspection process i, $k_{i,previous}$ is the previously calculated number of dies to be killed for the defects of inspection process i, $r_i$ is the kill rate for a given inspection process i, n is the number of processes which provided hits to the dies to be killed and m is the number of defects of a given type for a die being considered for the inspection process i.

11. The method as recited in claim 7 wherein the step of determining a yield loss for each inspection process based on the number of dies to be killed and a total number of dies includes calculating the yield loss by dividing the number of dies to be killed for a given inspection process by the total number of dies of the semiconductor wafer.

12. The method as recited in claim 7, further comprising the step of determining a killing probability yield loss for each inspection process based on the number of dies to be killed for each inspection process and a total number of defects for the inspection process.

13. A program storage device readable by machine, tangibly embodying a program of instructions executable by the machine to perform method steps for determining yield impact of process steps for semiconductor wafers having a plurality of dies, the method steps comprising:

mapping a location for each defect within each die at one or more inspection process steps;

mapping a location for each electrical failure within each die;

correlating specific defects on the dies to each specific electrical failure where indicated, each said correlation thereby indicating a hit;

determining a yield loss for each inspection process based on the number of dies to be killed and a total number of dies on the semiconductor wafer, said determination effected by a method comprising the steps of:

determining a number of dies to be killed by considering all dies with hits;

initializing the number of dies to be killed to zero;

modifying the number of dies to be killed by:

calculating a kill rate ratio between a kill rate for each process inspection having hits and a sum of the kill rates for all process inspections having hits; and adding the ratio to a previous number of dies to be killed, the previous number of dies to be killed being obtained at a previously considered die; and repeating the step of modifying until all dies have been considered.

14. The program storage device as recited in claim 13 wherein the step of correlating defects on the dies to electrical failures on the dies to determine hits on the dies includes the step of determining hits by assigning the defects of the dies to the electrical failures on the dies.

15. The program storage device as recited in claim 13 wherein the step of computing kill rates includes the step of computing kill rates for a given process inspection by dividing a number of hits on electrically failed dies by a number of defects for the process inspection.

16. The method as recited in claim 13 wherein the step of modifying is performed using the formula:

$$k_i = k_{i,previous} + m \cdot \frac{r_i}{\sum_{i=1}^{n} r_i} \qquad \text{EQ. 1}$$

where $k_i$ is a newly calculated number of dies to be killed for inspection process i, $k_{i,previous}$ is the previously calculated number of dies to be killed for the defects of inspection process i, $r_i$ is the kill rate for a given inspection process i, n is the number of processes which provided hits to the dies to be killed and m is the number of defects of a given type for a die being considered for the inspection process i.

17. The program storage device as recited in claim 13 wherein the step of determining a yield loss for each inspection process based on the number of dies to be killed and a total number of dies includes calculating, the yield loss by dividing the number of dies to be killed for a given inspection process by the total number of dies of the semiconductor wafer.

18. The program storage device as recited in claim 13, further comprising the step of determining a killing probability yield loss for each inspection process based on the number of dies to be killed for each inspection process and a total number of defects for the inspection process.

* * * * *